United States Patent
Clarke et al.

(10) Patent No.: US 7,217,947 B2
(45) Date of Patent: May 15, 2007

(54) SEMICONDUCTOR LIGHT SOURCE AND METHOD OF MAKING

(75) Inventors: Rowland C. Clarke, Sykesville, MD (US); Michel E. Aumer, Laurel, MD (US); Darren B. Thomson, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 257 days.

(21) Appl. No.: 10/912,153

(22) Filed: Aug. 6, 2004

(65) Prior Publication Data

US 2006/0027824 A1    Feb. 9, 2006

(51) Int. Cl.
*H01L 29/00* (2006.01)
(52) U.S. Cl. .............. 257/14; 257/91; 257/95; 257/96; 257/98; 257/99; 257/103; 257/E33.062; 257/E33.069; 257/E33.072; 257/E33.034; 257/E33.008
(58) Field of Classification Search ............... 257/14
See application file for complete search history.

(56) References Cited

U.S. PATENT DOCUMENTS

| | | | |
|---|---|---|---|
| 5,070,510 A * | 12/1991 | Konushi et al. | 372/46.01 |
| 6,818,465 B2 * | 11/2004 | Biwa et al. | 438/22 |
| 6,936,851 B2 * | 8/2005 | Wang | 257/79 |
| 7,084,421 B2 * | 8/2006 | Koike et al. | 257/14 |
| 2003/0218180 A1 * | 11/2003 | Fujiwara | 257/100 |
| 2004/0108513 A1 * | 6/2004 | Narukawa et al. | 257/103 |
| 2004/0217371 A1 * | 11/2004 | Okumura | 257/103 |
| 2005/0173694 A1 * | 8/2005 | Mawst et al. | 257/14 |

FOREIGN PATENT DOCUMENTS

JP        09036472 A   *  2/1997

* cited by examiner

*Primary Examiner*—Minhloan Tran
*Assistant Examiner*—Eduardo A. Rodela
(74) *Attorney, Agent, or Firm*—Birch, Stewart, Kolasch & Birch, LLP

(57) ABSTRACT

A solid state light emitting device having a plurality of semiconductor finger members with side walls perpendicular to a substrate. Multiple quantum wells are formed on the side walls, and are also perpendicular to the substrate. Each multiple quantum well is sandwiched between the side wall of a finger member and a second semiconductor member of a conductivity type opposite to that of the finger member. Ohmic contacts are applied to the finger members and second semiconductor member for receiving a voltage. The device is GaN based such that emitted light will be in the UV region.

8 Claims, 9 Drawing Sheets

SEMICONDUCTOR LIGHT SOURCE AND METHOD OF MAKING

BACKGROUND OF THE INVENTION

1. Field of the Invention

The invention in general relates to light sources and particularly to a solid state light source which is particularly well adapted to radiate light in the UV region. The term "light" as used herein is meant to apply to a generated wave of a particular wavelength, not necessarily in the visible portion of the electromagnetic spectrum.

2. Description of Related Art

A need exists for a compact, high power reliable UV (ultraviolet) light source. Such light source may be used in a variety of applications including the detection of chemical and biological agents. For example, a UV beam of a particular wavelength may be directed at an area under investigation causing fluorescence of any suspect agents that may be present. Detection and neutralization apparatus may then be utilized to clear the area.

Another application for such light source is in the production of visible light. More particularly, the UV radiation may be used to irradiate a particular phosphor which, in response to the radiation, will generate light in the visible region.

Solid state semiconductor UV light sources have been developed to meet these needs. As will be described, the conventional semiconductor UV light source suffers from various deficiencies including, but not limited to, crystal defects leading to losses and inefficiency, internal reflections which limit the amount of light output and a shifting of wavelength with applied voltage. In addition, if these devices are scaled to make them larger, the power, or light output does not increase in proportion to the scaling factor.

It is an object of the present invention to provide a semiconductor light source which obviates these deficiencies.

SUMMARY OF THE INVENTION

A semiconductor light source device is provided which includes a substrate and a plurality of semiconductor finger members of a first conductivity type on the substrate each having side walls perpendicular to the substrate. A multiple quantum well arrangement is located on each side wall of the semiconductor finger members and include a plurality of quantum well layers of a first material interposed between barrier layers of a second material, the layers being perpendicular to the substrate and including an outside layer.

A plurality of semiconductor members of a conductivity type opposite to that of the finger members is provided, with each positioned on an outside layer of a respective one of the multiple quantum well arrangements such that each multiple quantum well arrangement is sandwiched between a semiconductor finger member side wall and a semiconductor member. First and second ohmic contacts are respectively positioned on the semiconductor finger members and the semiconductor members.

The first and second materials of the multiple quantum wells are selected from a class of materials to emit a radiation of a particular wavelength upon application of a voltage between the first and second ohmic contacts. In a preferred embodiment, the materials are GaN based such that emitted light is in the UV region.

In another aspect, a method of fabricating a semiconductor light source includes the steps of growing an insulating semiconductor layer on a base member and growing a first semiconductor layer of a first conductivity type on the insulating layer. Portions of the first semiconductor layer are removed to form a plurality of semiconductor finger members having sidewalls perpendicular to the base member.

A multiple quantum well, comprised of alternate quantum well and barrier layers, is grown over the semiconductor finger members including the sidewalls, and a second semiconductor layer, of a conductivity type opposite to that of said first semiconductor layer, is grown over the multiple quantum well.

The multiple quantum well and second semiconductor layer are removed from the top surface of the finger members and an ohmic contact is formed on each finger member and on the second semiconductor layer which is located between the finger members.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

In the description to follow, terms such as vertical, horizontal top, bottom, front and back are used for ease of explanation and not as structural or orientation limitations. Further, although the present invention is applicable to the generation of various wavelengths, it will be described, by way of example, with respect to the generation of light in the UV range, which is around 400 nm (nanometers) to 4 nm.

Figure 1:
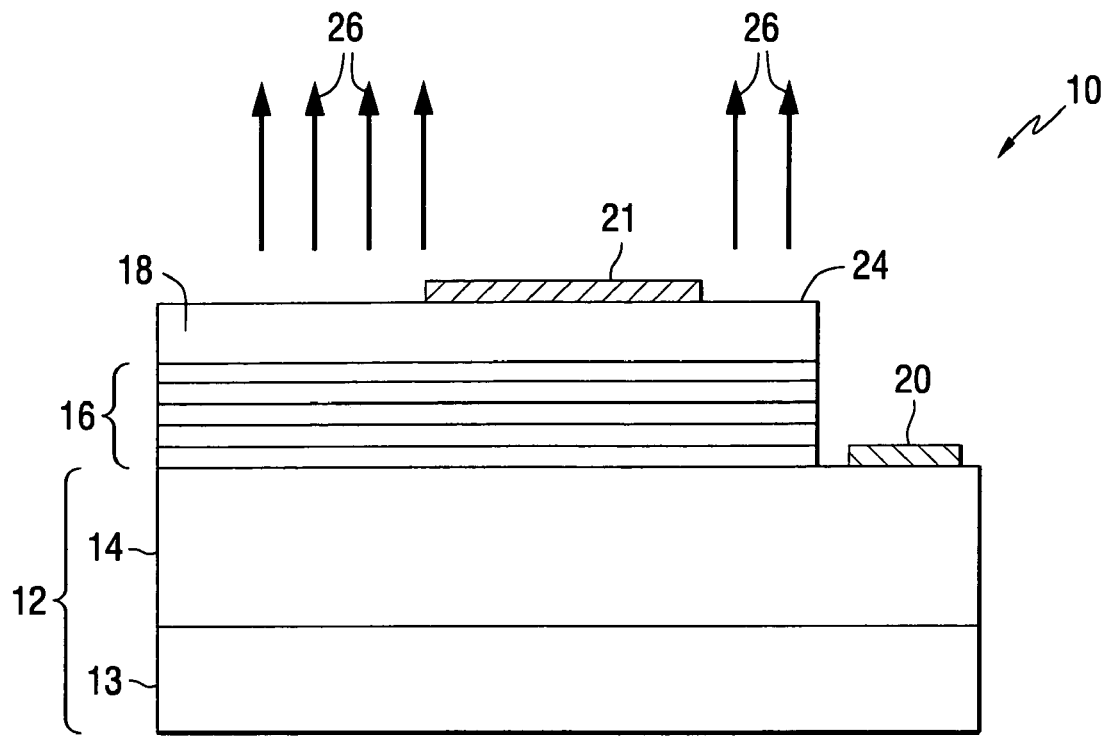
FIG. 1 is a view of a prior art semiconductor light source.

The semiconductor light source 10 in FIG. 1 includes a substrate 12 comprised of a base 13, such as sapphire, and a buffer layer 14. For UV generation, a GaN (gallium nitride) crystal system is preferred, and accordingly, buffer layer 14 is comprised of AlGaN (aluminum gallium nitride) with doping to make, for example, an n-type semiconductor member. Positioned on top of the buffer layer 14 is a multiple quantum well arrangement 16 comprised of alternate layers of thin quantum wells and thicker barrier layers.

Very basically, if a given semiconductor material with a small energy gap is sandwiched between energy barriers from a semiconductor material with a larger energy gap, a quantum well is formed between the barriers. If the multiple quantum well arrangement is sandwiched between n-type and p-type semiconductors to which an electric voltage is applied, holes from the p-type semiconductor material combine with electrons from the n-type semiconductor material resulting in the release of photons of a particular wavelength, depending upon the composition and width of the multiple quantum well. For GaN based materials, the wavelength is in the UV region.

A p-type semiconductor member 18 contacts the other side of the multiple quantum well 16, and ohmic contacts 20 and 21 are respectively positioned on the n-type buffer layer 14 and on the p-type member 18. When a voltage is applied across these contacts, UV light is generated and projects primarily out the top surface 24, as indicated by rays 26.

The multiple quantum well 16 is GaN based and when the crystal is grown horizontally, parallel to the substrate 12, a particular class of defects, called dislocations, results and can exceed $10^8$ cm$^{-2}$ through the region in which electrical current is converted into light. This defect density significantly reduces the efficiency of the device and is unacceptable for UV generation.

Another result of the multiple quantum well crystal orientation of FIG. 1 is a polarization effect wherein the electric field produces the Quantum Confined Stark Effect which causes an objectionable shift in wavelength as a function of drive current. The electric field is a force which tries to keep electrons and holes separated and if separated, they are not properly combining. This Quantum Confined Stark Effect is useful in multiple quantum well light modulators but is unwanted in multiple quantum well light generators.

Figure 2:
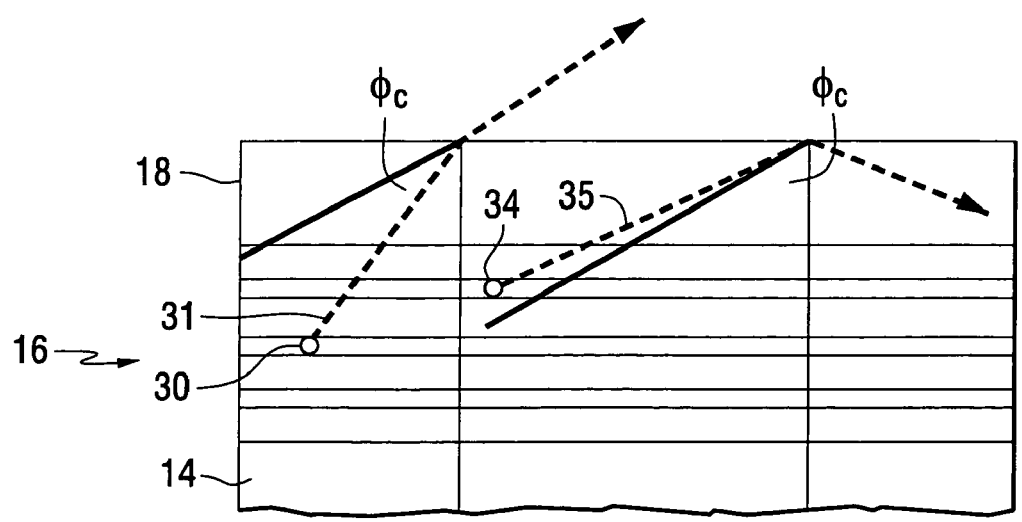
FIG. 2 illustrates light reflection in the prior art device of FIG. 1.

Another problem with the device of FIG. 1 is illustrated in FIG. 2. Numeral 30 represents a generated photon which takes the path indicated by numeral 31. As long as the path angle, where it meets the interface of member 18 and air, is less than the critical angle $\phi_c$ the photon will contribute to the total light output. If, however, a photon such as photon 34 takes the path 35, it will be greater than the critical angle $\phi_c$ and will be internally reflected, thus reducing the total light output.

Figure 3:
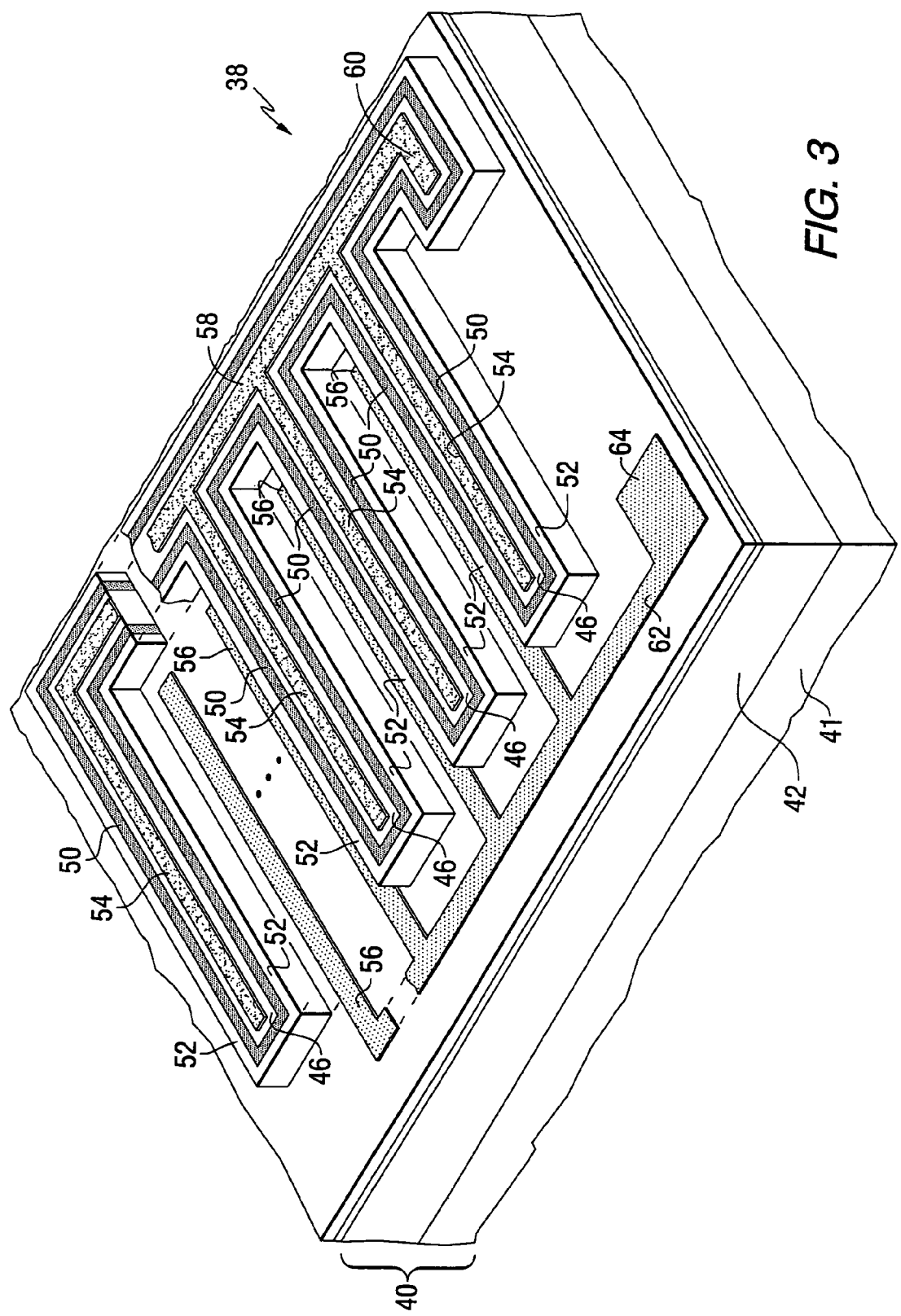
FIG. 3 is a perspective view of one embodiment of the present invention.
Figure 4:
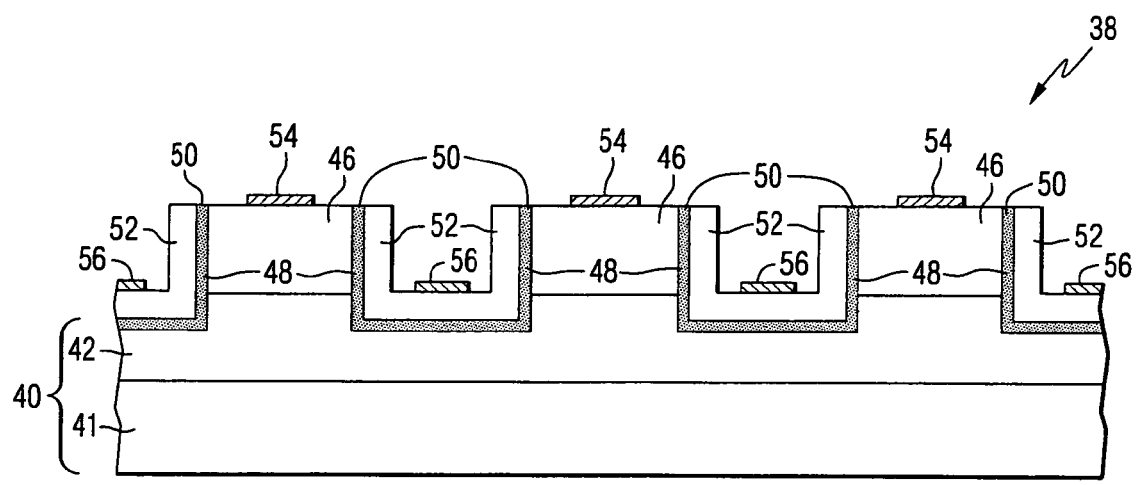
FIG. 4 is a cross-sectional view through a portion of the structure of FIG. 2.

A semiconductor light source in accordance with the present invention eliminates these problems, and one embodiment is illustrated in the perspective view of FIG. 3 and the corresponding cross-sectional view of FIG. 4. The light source 38 includes a substrate 40 comprised of a base 41 and buffer layer 42. By way of example, the base 41 may be sapphire with the buffer layer 42 being constituted by an insulating AlGaN.

The device includes a plurality of parallel semiconductor finger members 46 of a first conductivity type, for example, n-type, and having vertical side walls 48 perpendicular to the substrate 40 and are of AlGaN. A multiple quantum well arrangement 50 is grown, and positioned on these side walls 48 such that the multiple quantum well layers are all perpendicular to the substrate 40.

A plurality of AlGaN semiconductor members 52 are provided, each on the outside layer of a multiple quantum well 50 and are of a conductivity type opposite to that of finger members 46. That is, semiconductor members 52 are of p-type material also of AlGaN. With this arrangement, each multiple quantum well 50 is sandwiched between an n-type semiconductor finger 46 and a p-type semiconductor member 52.

An ohmic contact 54 is positioned on top of each finger member 46 while an ohmic contact 56 is in electrical contact with each semiconductor member 52. Ohmic contact 54 may be of a titanium aluminum composition and ohmic contact 56 may be comprised of a nickel-gold composition, by way of example.

As best seen in FIG. 3, all of ohmic contacts 54 are connected to an ohmic contact bus 58 which is connected to pad 60 and all ohmic contacts 56 are connected to ohmic contact bus 62 which is connected to pad 64. In operation, an electric voltage will be applied across pads 60 and 64 to generate the desired UV light from the multiple quantum wells 50. It is to be noted that the device illustrated in FIG. 3 represents one device of n such devices which may be simultaneously grown on the substrate and subsequently separated into n or more individual pieces for use.

Figure 5:
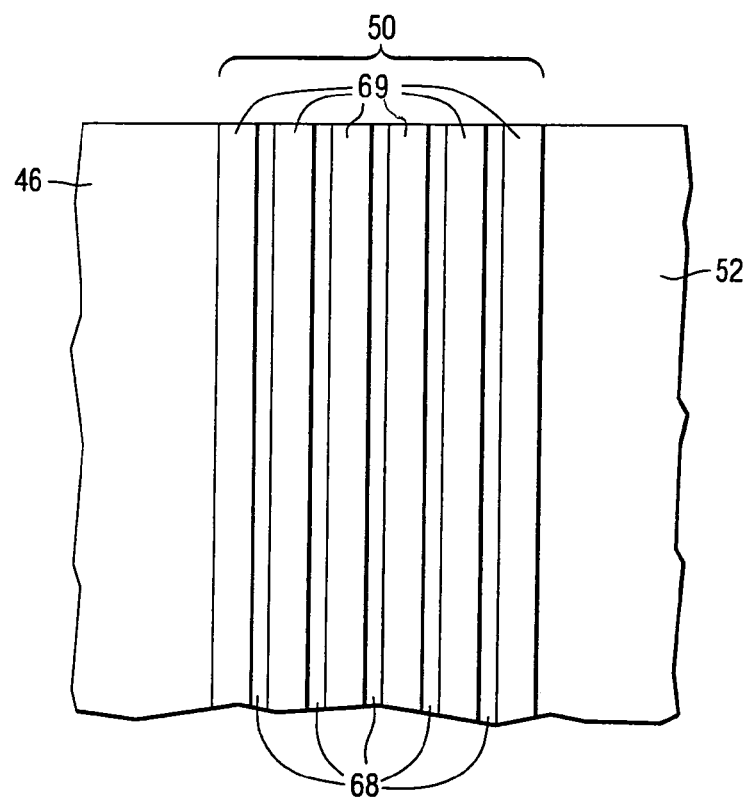
FIG. 5 is a view of a multiple quantum well arrangement.

FIG. 5 illustrates, in somewhat more detail, a typical multiple quantum well arrangement 50. The multiple quantum well 50 is comprised of alternating layers of relatively thin quantum wells 68 of a first material, interposed between thicker barrier layers 69 of a second material. For UV generation, using a GaN system, the multiple quantum well structure may consist of any combination of alternating layers of $Al_xIn_yGa_{1-x-y}N$ with different compositions, where $0 \leq x \leq 1$ and $0 \leq y \leq 1$, with the particular selection of x and y governing the wavelength of light output.

It is known that the lateral growth of a GaN crystal significantly reduces crystal defects. The present invention takes advantage of this phenomenon by growing a multiple quantum well structure comprised of different layers of laterally grown $Al_xIn_yGa_{1-x-y}N$, perpendicular to a substrate, and where x and y are different for adjacent layers. With this construction, the dislocations present in prior art devices may be reduced by 3 to 6 orders of magnitude. In addition, this construction eliminates the undesired aforementioned Quantum Confined Stark Effect.

Figure 6:
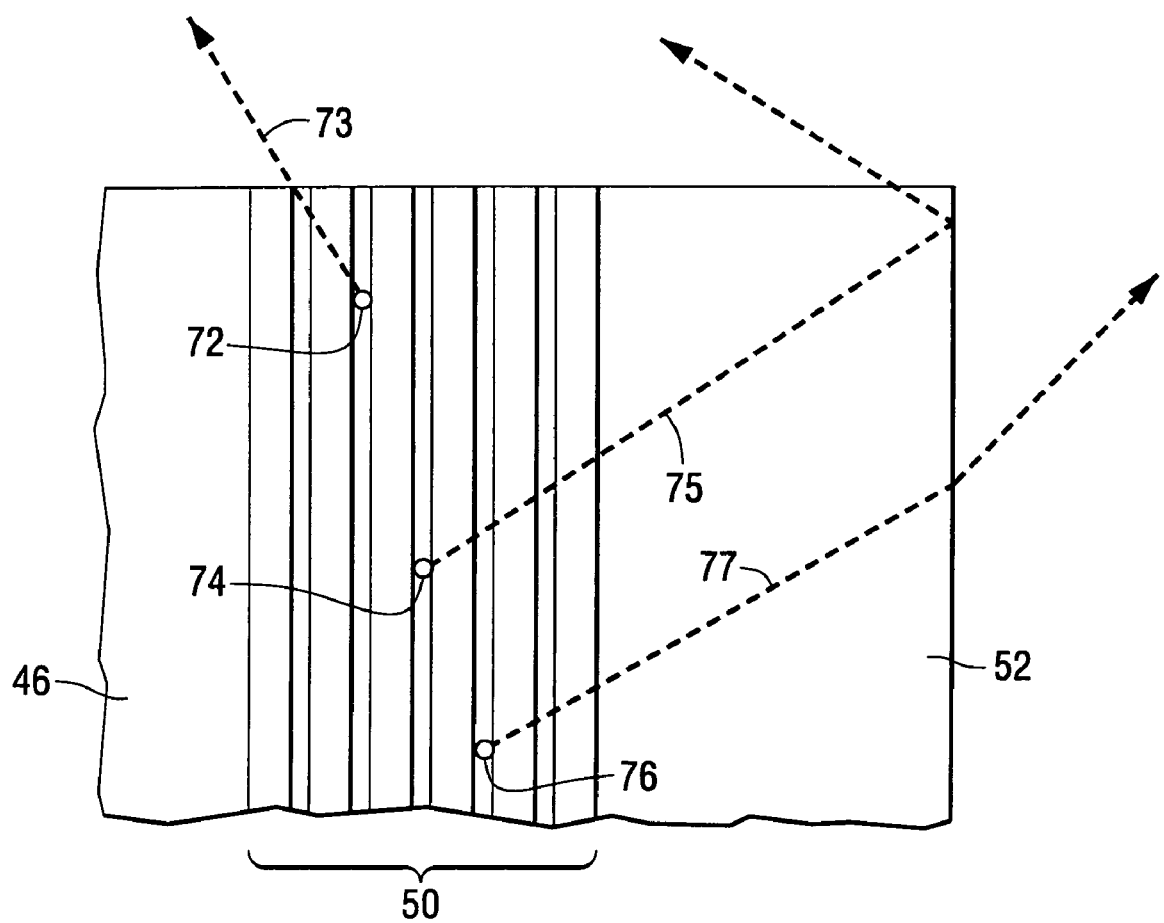
FIG. 6 illustrates light reflection in the device of the present invention.

The light source of the present invention also allows for a greater light output than the device of FIG. 1. More particularly, with reference to FIG. 6 a photon 72 emerges out the top, or emitting surface of multiple quantum well 50 via the path 73. A photon 74 strikes the semiconductor 52/air interface at greater than the critical and is internally reflected, as indicated by path 75. The internally reflected photon however, emerges out the top of semiconductor member 52 and contributes to the total light output. This is also true of photon 76 striking the interface at less than the critical angle via the path 77 to emerge out the side of semiconductor 52 but still contributing to total light output from the top surface of the device.

Figure 7:
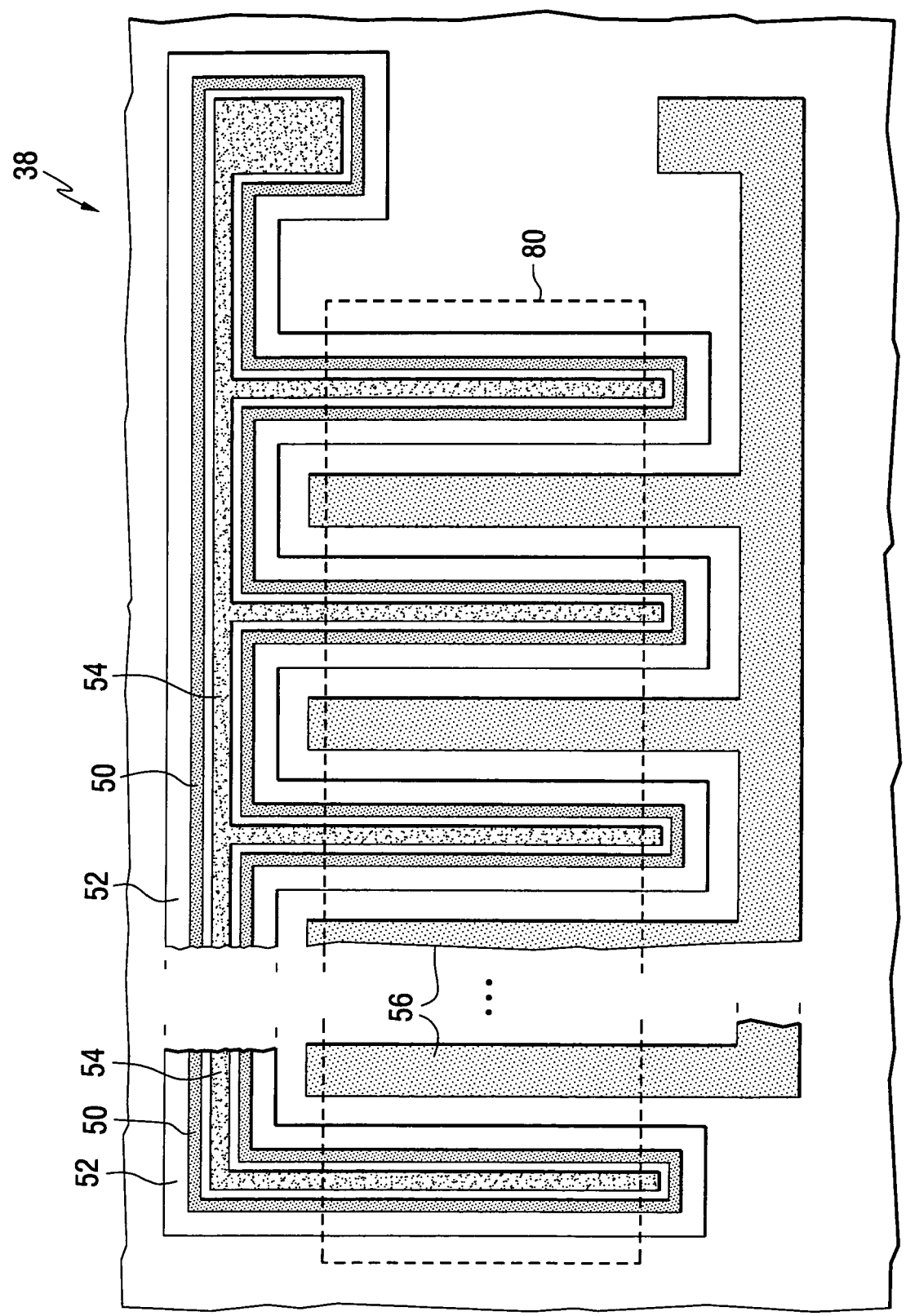
FIG. 7 is a plan view of the structure of FIG. 2.

FIG. 7 is a plan view of the device 38 of FIG. 3 and illustrates an isolation feature of the device. During the fabrication process the device may be bombarded by ions such as helium ions in selective areas to neutralize the conductivity of n-type and p-type semiconductor portions of the device. By selectively masking an area encompassing the major portion of the finger members 46, as designated by dotted rectangle 80, all such n-type and p-type semiconductor material outside the rectangle will be converted into an electrically neutral AlGaN so that only that portion of finger members 46, multiple quantum wells 50 and semiconductor members 52 contained within rectangle 80 will be active.

A preferred method of fabricating the semiconductor light source is by the well-known MOCVD (metalorganic chemical vapor deposition) process, and to this end reference is made to FIGS. 8A through 8F.

Figure 8A:
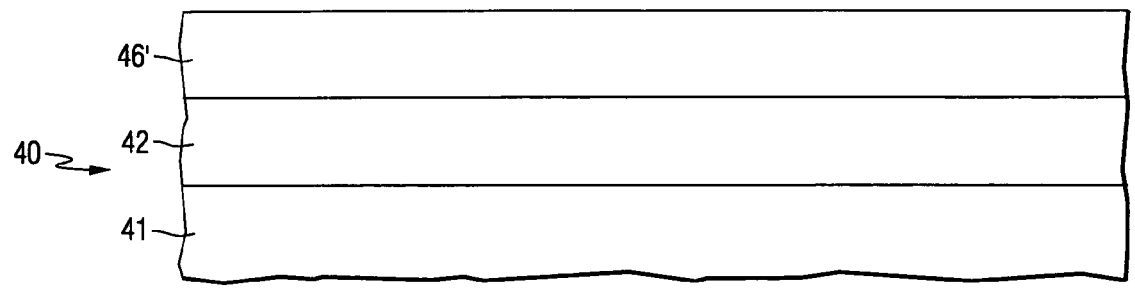
FIGS. 8A through 8F illustrate the processing steps for fabricating the device of the present invention.
Figure 8B:
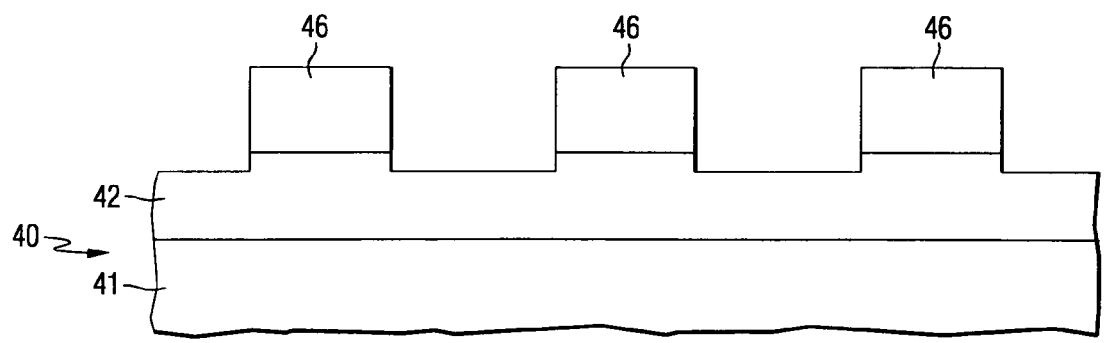

In FIG. 8A a base wafer 41, such as sapphire, or the like, is placed on a graphite susceptor (not illustrated) and heated in the MOCVD apparatus. The insulating AlGaN buffer layer 42 is formed over the base 41 and then a dopant is added to grow n-type AlGaN layer 46', the precursor to finger members 46. The structure of FIG. 8A is removed from the MOCVD apparatus and is masked and etched to form the plurality of finger members 46, as illustrated in FIG. 8B.

Figure 8C:
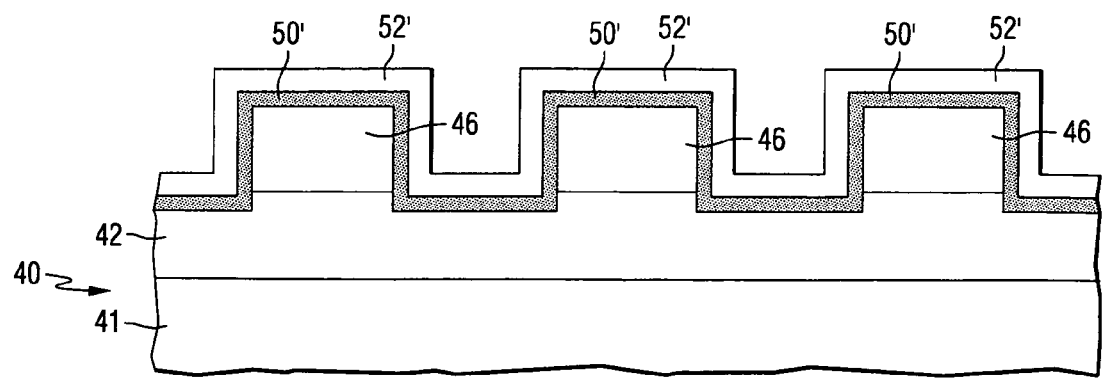

The structure is again placed in the MOCVD apparatus and, as illustrated in FIG. 8C, layers of the multiple quantum well are grown over the exposed buffer layer 42 and finger members 46, as indicated by the numeral 50'. After the last layer of multiple quantum well is grown, a dopant is added to the gases to then grow the p-type semiconductor 52' over the multiple quantum well layer 50'.

Figure 8D:
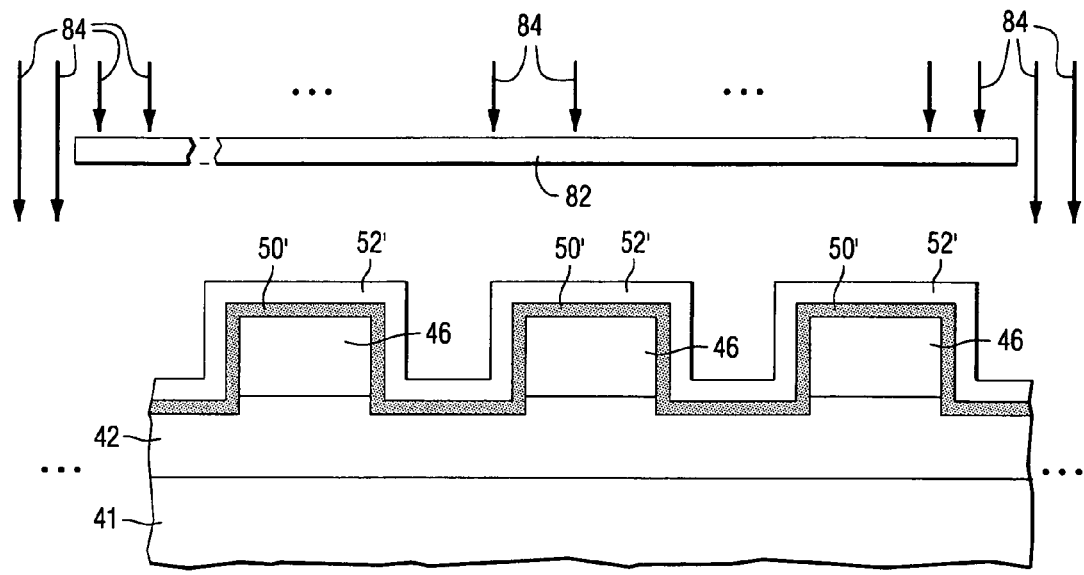

At this point the structure may be removed to create the isolation discussed with respect to FIG. 7. For this purpose, as illustrated in FIG. 8D, a mask 82 is placed over the intended isolation region and the device is subjected to ion bombardment, as indicated by arrows 84.

Figure 8E:
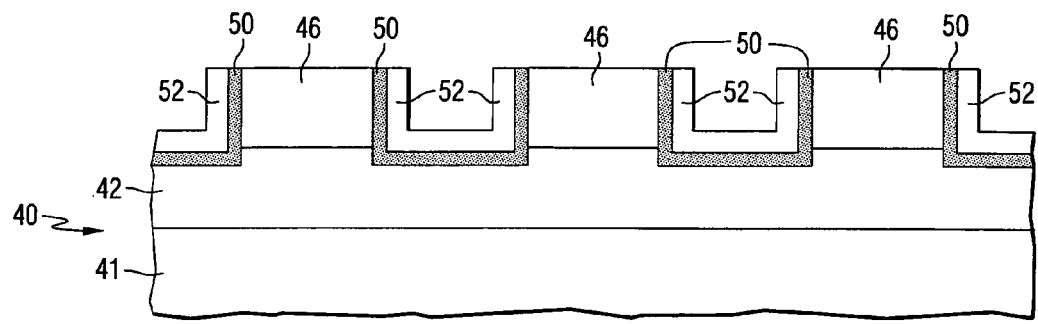
Figure 8F:
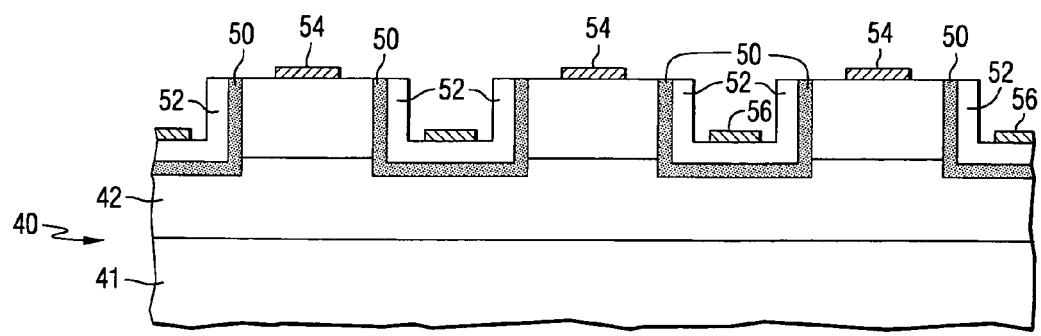

A masking and etching step removes the the semiconductor 52' and multiple quantum well 50' from the tops of the finger members 46, resulting in the structure of FIG. 8E. Next, and as indicated in FIG. 8F, the ohmic contacts 54 and 56 are formed on the finger members 46 and semiconductor members 52, respectively.

Light is projected out the top, or emitting surface of the multiple quantum wells 50. However, light is also projected toward the opposed, or bottom surface of the multiple quantum well. The extraction efficiency of the device may be significantly increased if that light could be redirected toward the emitting surface. This may be accomplished by adding another layer in the manufacturing process, as illustrated in FIG. 9.

Figure 9:
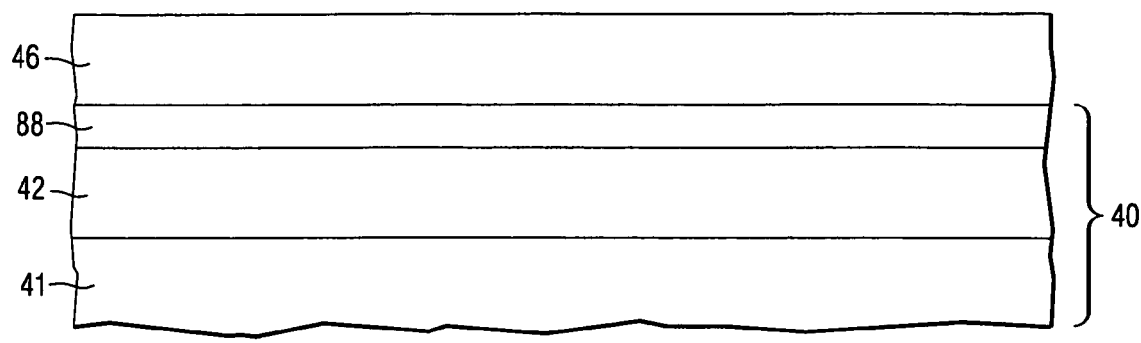
FIG. 9 illustrates an alternate substrate which may be used.
Figure 10:
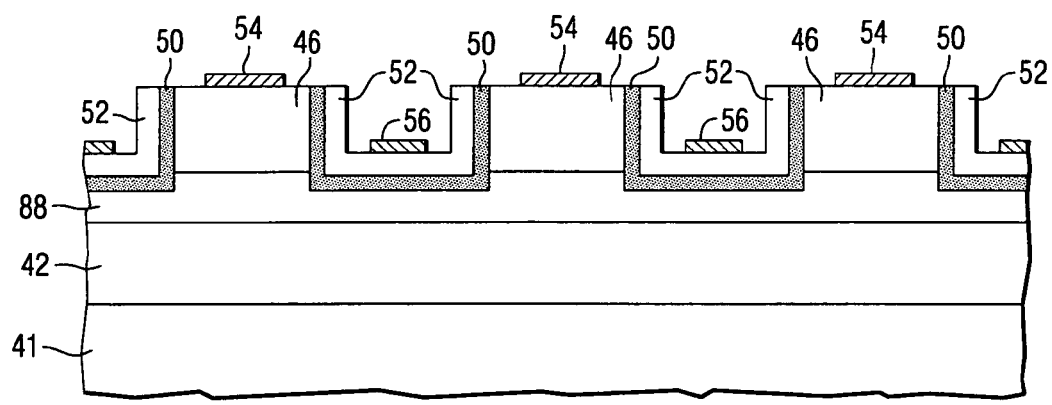
FIG. 10 illustrates a device using the substrate of FIG. 9.

In FIG. 9 the base 41 and buffer 42 are the same as in FIG. 8A. The substrate 40 includes an additional layer 88 which is a quarter wavelength reflector tuned to the operating wavelength of the device. The process steps are identical to those described in FIGS. 8B to 8F, however with the reflective layer 88 being positioned behind the bottom surface of multiple quantum wells 50, as indicated in FIG. 10.

Figure 11:
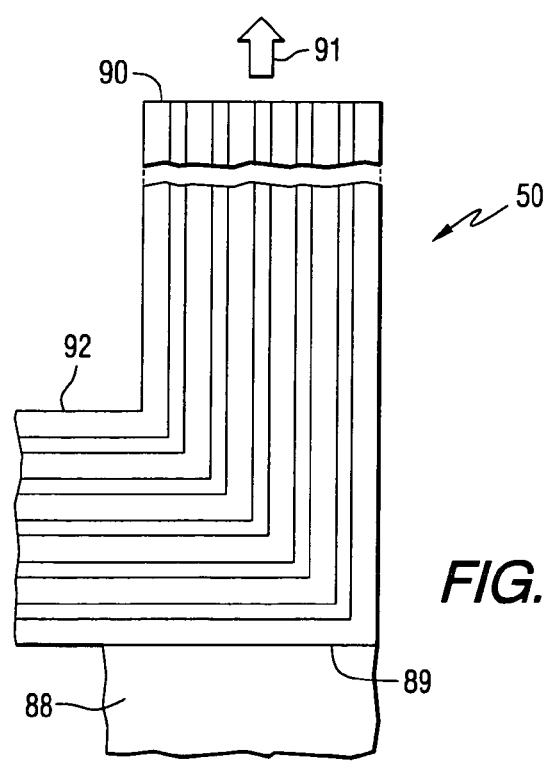
FIG. 11 is a more detailed view of a portion of the substrate of FIG. 10.

A close up view of the structure is illustrated in FIG. 11. Any light directed toward the opposed surface 89 of the multiple quantum well 50 will be redirected toward the emitting surface 90 by the Bragg reflector 88 and will contribute to the light output, indicated by arrow 91. Although the structure includes a horizontal portion 92 of multiple quantum well, such portion is not located between opposite conductivity type semiconductors to which a voltage is applied and accordingly, will not have an applied electric field across it. Therefore, no light will be generated from it.

Figure 12:
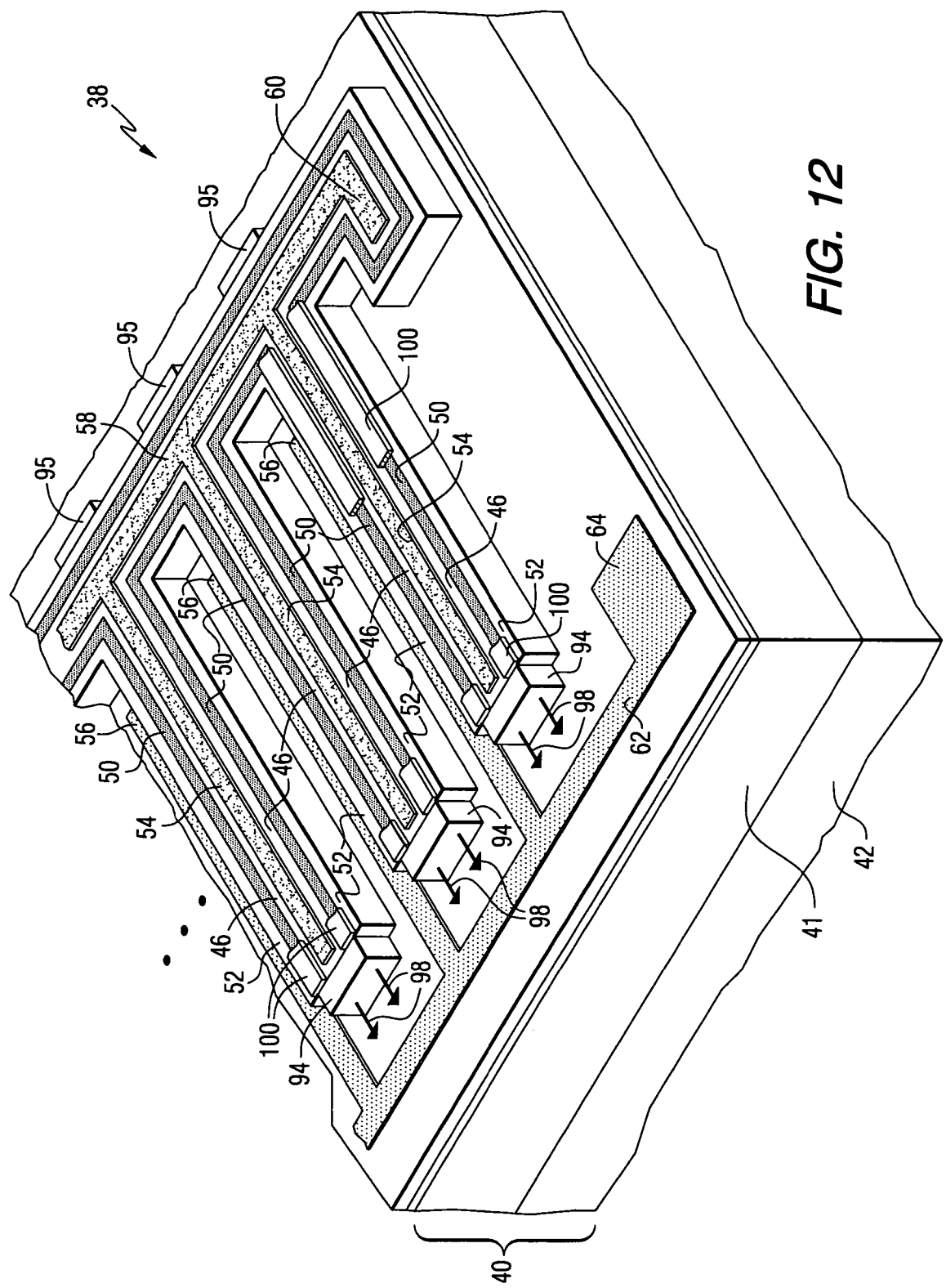
FIG. 12 illustrates a modification for generation of a laser beam.

The structure thus far described may be characterized as an LED (light emitting diode). The structure may also operate as a laser diode, and to this end, reference is made to FIG. 12. FIG. 12 is similar to FIG. 3, however it is modified to generate laser light. More specifically, each front, or first end of the finger which includes the semiconductor finger members 46, multiple quantum wells 50 and semiconductor members 52 has been replaced by respective reflectors 94, with corresponding reflectors 95 being positioned at the second, opposed end of the fingers.

Photons traveling longitudinally along a multiple quantum well 50 will be reflected at the front and opposed surfaces due to reflectors 94 and 95. During this travel the photons will stimulate the generation of other photons until such time that a percentage of photons will emerge through the front reflector 94 as laser generated light, as indicated by arrows 98.

In order to eliminate generated light from emerging from the top surface of a multiple quantum well 50, a cladding 100 of electrically neutral material is grown over the top surface of each multiple quantum well 50 as indicated in FIG. 12.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A semiconductor light source device, comprising:
    a substrate;
    a plurality of semiconductor finger members of a first conductivity type on said substrate each having side walls perpendicular to said substrate;
    a multiple quantum well arrangement on each said side wall of said semiconductor finger members and including a plurality of quantum well layers of a first material interposed between barrier layers of a second material, said layers being perpendicular to said substrate and including an outside layer,
    said first and second material being selected from a class of materials which emit radiation of a particular wavelength upon application of a voltage between a first and a second ohmic contact,
    a plurality of semiconductor members of a conductivity type opposite to that of said finger members, with each positioned on an said outside layer of a respective one of said multiple quantum well arrangements such that each said multiple quantum well arrangement is sandwiched between a side wall of said semiconductor finger members and a semiconductor member of said plurality of semiconductor members;
    said first and second ohmic contacts being respectively positioned on said semiconductor finger members and said semiconductor, and
    wherein each said multiple quantum well arrangement includes a top and bottom surface and first and second opposed ends; and which includes;
    light reflectors positioned at each of said first and second ends of each said multiple quantum well arrangement; and
    a cladding layer positioned on said top surface to prevent generated light from exiting through said top surface.

2. A device according to claim 1 wherein:
    said semiconductor finger members, semiconductor members and said multiple quantum wells are GaN based materials; and
    said radiation is in the UV region.

3. A device according to claim 2 wherein:
    said semiconductor finger members and said semiconductor members are AlGaN materials.

4. A device according to claim 2 wherein:
    said quantum well layers and said barrier layers of said multiple quantum well are comprised of $Al_xIn_yGa_{1-x-y}N$ where $0 \leq x \leq 1$ and $0 \leq y \leq 1$; and wherein,
    said x and said y for said quantum well layer are different from that of said barrier layer.

5. A device according to claim 2 wherein:
said semiconductor finger members are parallel to one other.

6. A device according to claim 1 wherein:
said multiple quantum well includes an emitting surface and an opposed surface; and which includes
a Bragg reflector positioned behind said opposed surface and operable to redirect any light impinging upon it back to said emitting surface.

7. A device according to claim 1 wherein:
said semiconductor finger members are of an n-type or p-type semiconductor material;
said semiconductor members are of an opposite conductivity type; and which includes
an active zone encompassing the major portion of said semiconductor finger members;
any n-type or p-type semiconductor material outside of said active zone being electrically neutralized.

8. An elemental semiconductor light source, comprising:
a substrate;
first and second semiconductor members of opposite conductivity types positioned on said substrate and having side walls perpendicular to said substrate;
a multiple quantum well arrangement sandwiched between said first and second semiconductor members and including a plurality of quantum well layers of a first type material interposed between barrier layers of a second type material, said layers being perpendicular to said substrate,
said first and second type materials being selected from a class of materials which operate to emit radiation of a predetermined wavelength upon application of a voltage between first and second ohmic contacts,
said first and second ohmic contacts respectively being positioned on said first and second semiconductor members;
wherein each said multiple quantum well arrangement includes a top and bottom surface and first and second opposed ends; and which includes;
light reflectors positioned at each of said first and second ends of each said multiple quantum well arrangement; and
a cladding layer positioned on said top surface to prevent generated light from exiting through said top surface.

* * * * *